United States Patent [19]
Goh et al.

[11] Patent Number: 5,872,365
[45] Date of Patent: Feb. 16, 1999

[54] UV IRRADIATION APPARATUS

[75] Inventors: Kyoon-hee Goh; Chul-hui Kim; Byung-kwan Lee, all of Incheon; Seung-ug Kim, Kyungki-do; In-hyub Park, Yongin; Young-chul Jeong, Koyang; Woung-kwan An; Dong-ho Kim, both of Yongin; Hun Cha, Suwon; Choung-hyep Kim, Seoul; Guk-hyeong Cho, Yongin, all of Rep. of Korea

[73] Assignee: Samsung Electronics Co., Ltd., Suwon, Rep. of Korea

[21] Appl. No.: 679,084

[22] Filed: Jul. 12, 1996

[30] Foreign Application Priority Data

| Jul. 13, 1995 | [KR] | Rep. of Korea | 95-20640 |
| Jul. 13, 1995 | [KR] | Rep. of Korea | 95-20641 |
| Jul. 28, 1995 | [KR] | Rep. of Korea | 95-22942 |
| Jul. 28, 1995 | [KR] | Rep. of Korea | 95-22943 |
| Jul. 28, 1995 | [KR] | Rep. of Korea | 95-22944 |

[51] Int. Cl.$^6$ ............................................. G01J 1/00
[52] U.S. Cl. ................................. 250/492.1; 250/504 R
[58] Field of Search .......................... 250/452.1, 493.1, 250/494.1, 504 R

[56] References Cited

U.S. PATENT DOCUMENTS

| 4,311,759 | 1/1982 | Glennon | 428/345 |
| 4,581,248 | 4/1986 | Roche | 427/53.1 |
| 4,644,899 | 2/1987 | Glaus | 250/504 R |
| 4,694,180 | 9/1987 | Salisbury et al. | 250/492.1 |
| 4,900,938 | 2/1990 | Suzuki et al. | 250/492.1 |
| 5,017,839 | 5/1991 | Arlt et al. | 315/219 |
| 5,109,181 | 4/1992 | Fischer et al. | 313/571 |
| 5,220,171 | 6/1993 | Hara et al. | 250/443.1 |
| 5,231,291 | 7/1993 | Amemiya et al. | 250/443.1 |
| 5,426,308 | 6/1995 | Sudduth et al. | 250/504 R |
| 5,435,379 | 7/1995 | Moslehi et al. | 250/443.1 |
| 5,440,137 | 8/1995 | Sowers | 250/504 R |

*Primary Examiner*—Bruce Anderson
*Attorney, Agent, or Firm*—Jones & Volentine, L.L.P.

[57] ABSTRACT

A UV irradiation apparatus, which includes a UV lamp installed in a chamber for generating UV rays; a vacuum chuck installed below the UV lamp for supporting and moving a wafer; and, a reflector surrounding the UV lamp for concentrating UV rays on the vacuum chuck. The apparatus further includes heating blocks for controlling the temperature at both sides of the vacuum chuck. Thus, it is possible to maintain an essentially constant temperature around the wafer supported by the vacuum chuck. As a result of the temperature control, when a protection tape attached to the front side of the wafer is irradiated with UV rays, an adhesive of the protective tape can be effectively degraded by a chemically reaction under optimum conditions, to thereby easily detach the protection tape from the wafer.

13 Claims, 16 Drawing Sheets

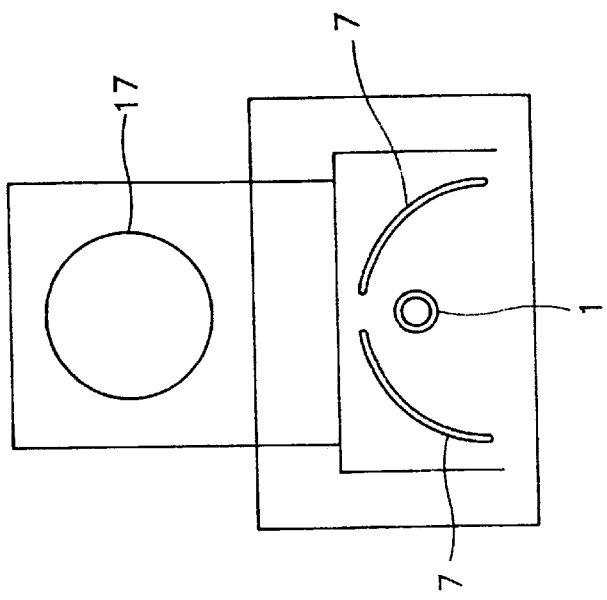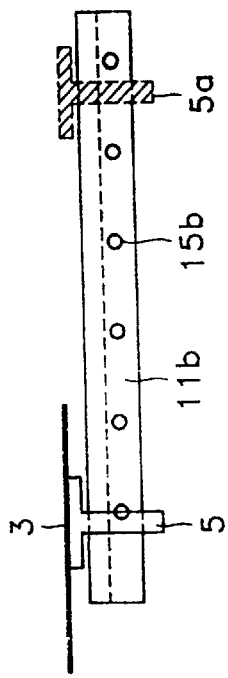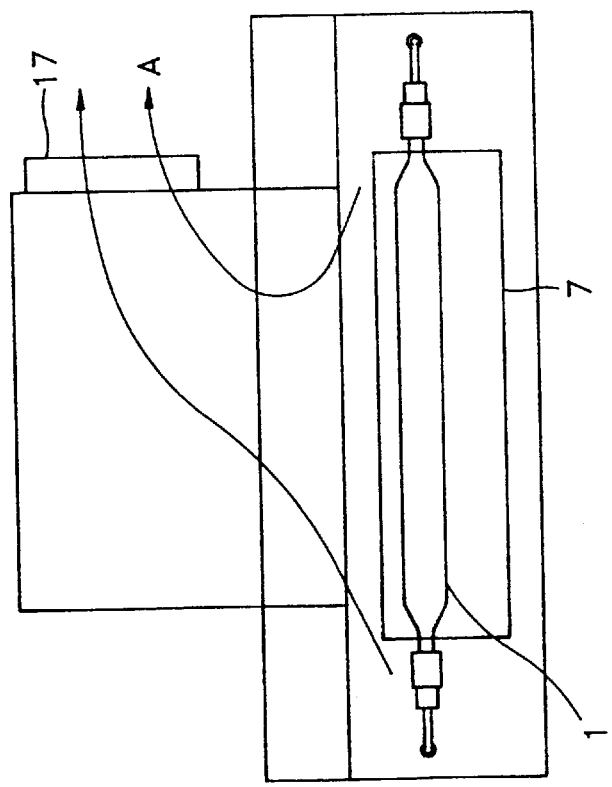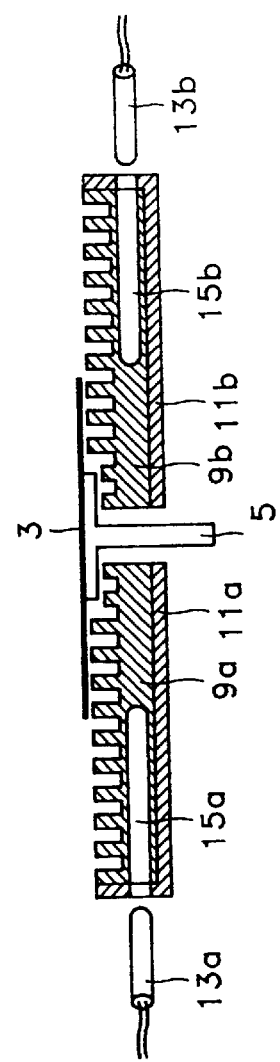
FIG.1
FIG.2

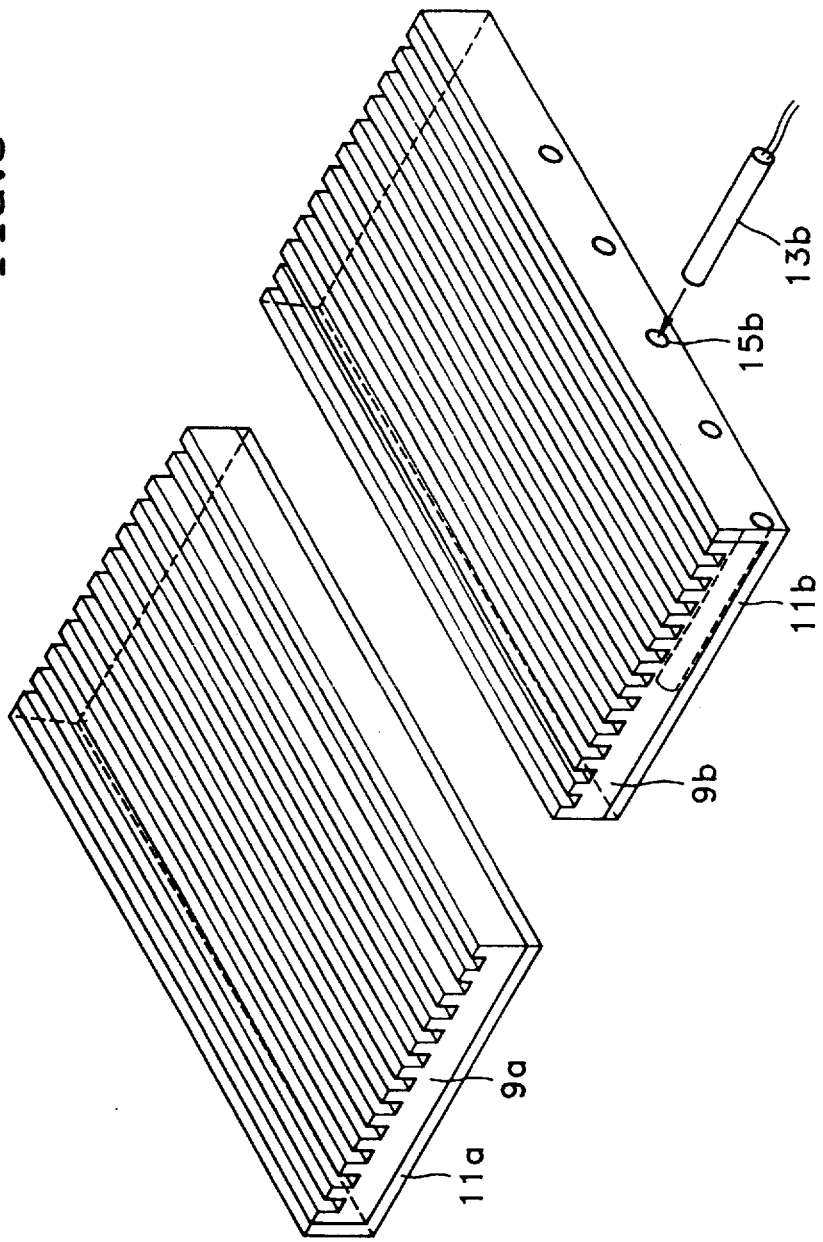

FIG.17
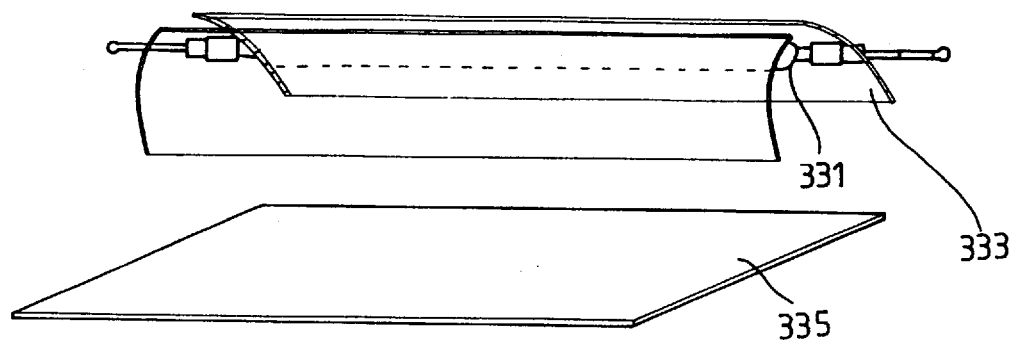
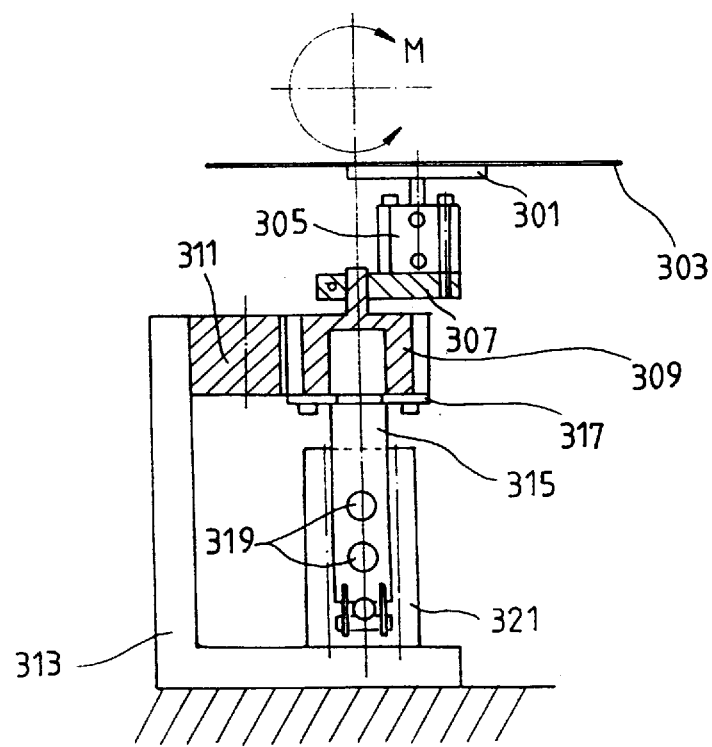

UV IRRADIATION APPARATUS

BACKGROUND OF THE INVENTION

The present invention relates to an ultraviolet (UV) irradiation apparatus which may be used in a process for manufacturing a semiconductor device, and more particularly, to a UV irradiation apparatus adapted to facilitate detaching a protective tape from the front side of a back-ground wafer.

In general, a semiconductor device is manufactured on a wafer which is subject to many processes. Good products are selected out of the manufactured semiconductor device by measuring their electrical characteristics, and the selected semiconductor devices are then packaged. In the present process, the wafer is formed to be thin and results in at least one semiconductor device which has been processed to be thin. A method of back-grinding a wafer is widely used as a means to thin the wafer for the semiconductor device after the process of manufacturing it is completed. The process of back-grinding is performed by the steps of: attaching a protection tape to the front side of the wafer in order to protect the semiconductor device; thinning the wafer by back-grinding while the protection tape is attached, by back-grinding; and eliminating the protection tape attached to the front side of the back-ground wafer. In the subsequent process step to eliminate the protective tape backing, a UV irradiation apparatus is widely used. The protective backing has an adhesive coated on one side of the protection tape to cause the tape to adhere to the wafer, and this adhesive coating can be caused to lose its adhesive property via a chemical reaction when exposed to UV. Accordingly, the wafer with the protective tape adhered thereon is usually transferred to the UV irradiation apparatus in order that the upper portion of the tape can be irradiated. Therefore, the UV rays cause the adhesive property to be lost so that the protection tape can be removed from the wafer. Such chemical reaction of the adhesive is affected by both the temperature and the distribution of the UV irradiation on the adhesive.

The conventional UV irradiation apparatus consists of a UV lamp for generating UV rays which is fixed in a chamber, a wafer transferor installed under the UV lamp for transferring the wafer, and a reflector adapted to surround the UV lamp in order to concentrate UV on the wafer and wafer transferor. In such a process step, a vacuum chuck or a roller is widely used as the wafer transferor.

In general, the transferring method is by a vacuum chuck which rotates and at the same time, horizontally transfers the wafer lying thereon to the UV irradiation apparatus, or only horizontally transfers it. In such a process, when the vacuum chuck rotates the wafer, the wafer thereon is rotated on its center axis. Accordingly, this results in the central portion of the wafer being concentratedly irradiated with more UV rays than that of the peripheral portion thereof. Likewise in the wafer transfer method which utilizes a roller, the wafer is horizontally moved according to a rotating movement of a plurality of rollers upon which the wafer lies. A desired uniform smooth transfer movement is difficult to obtain in such a process. Since each of the rollers can neither rotate at a uniform speed nor transfer a uniform force to the wafer, a smooth movement of the wafer is prevented. As the result it is difficult to automate such a step without jamming occurring, which presents manufacturing problems. If a successive wafer is prevented from proceeding to or from the UV irradiation apparatus, it results in a halt to the desired UV irradiation process step which cannot be performed.

Another difficulty in the irradiation process is caused by the UV lamp, which usually generates not only the desired UV rays but also undesired infrared and visible rays. Thus, the wafer is also irradiated with the undesired infrared rays and visible rays. This usually leads to an increase in the temperature of the wafer and thereby causing the wafer to suddenly cool down to room temperature after completing the UV irradiation. Thus, the undesired quick-cooling problem prevents the adhesive from completely losing its adhesive property before cooling.

In the conventional UV irradiation apparatus, the UV lamp is fixed in a chamber so that it is impossible to freely control a distance between the UV lamp and a wafer. Accordingly, since the amount of UV irradiated on the wafer cannot be appropriately controlled, it is difficult to maximize a chemical reaction within the adhesive to cause it to release the wafer. The temperature around the wafer is a result of the heat generated only by the UV lamp and it is difficult to freely provide an optimum temperature where the adhesive can lose its adhesive property.

As pointed out above, in the conventional UV irradiation apparatus where a wafer is transferred by rollers, the horizontal movement of wafer is not smooth. Therefore, when the wafer after UV irradiation is loaded on a carrier, the wafer can be damaged or broken due to colliding with the carrier.

By the conventional UV irradiation apparatus as described above, the whole surface of the wafer cannot be uniformly irradiated with UV rays, which makes it difficult to freely control the quantity of UV irradiation on the wafer and the temperature of the wafer. The temperature of the wafer can be also increased by the UV irradiation apparatus lamp. Such a UV lamp also results in irradiation of infrared rays which generate heat, and further the heated wafer suddenly cools to a room temperature after that the UV irradiation on the adhesive on the wafer surface sometimes does not lose its adhesive property. In such a case, it is difficult to easily eliminate the protective tape from the wafer surface.

SUMMARY OF THE INVENTION

Accordingly, it is an object of the present invention to provide a UV irradiation apparatus for easily eliminating from a wafer a protective tape which is attached to the front side of a back-ground wafer.

It is another object of the present invention to provide a UV irradiation apparatus for easily eliminating a protective tape attached to the front side of a back-ground wafer and for exactly placing the wafer from which the protective tape has been eliminated.

To accomplish the above object, a first embodiment of the present invention provides a UV irradiation apparatus, said apparatus comprising a UV lamp for generating UV rays and installed in a chamber, a vacuum chuck installed below said UV lamp for supporting and moving a wafer having a protective tape that is attached to its front side by an adhesive, and a reflector installed to surround the UV lamp in order to concentrate UV rays on the vacuum chuck, and further comprising:

a plurality of heating blocks arranged to control the temperatures at both sides of the vacuum chuck.

According to the first embodiment of the present invention, the temperature of the UV-irradiated wafer can be gradually cooled by utilizing the heating block which comprises a heater apparatus for controlling a temperature that is installed under the vacuum chuck supporting at least one wafer. Such gradual cooling permits the protective tape attached to the front side of the wafer to be more easily removed.

To accomplish the above object, a second embodiment of the present invention still further provides a UV irradiation apparatus, said apparatus comprising: a light source set support; installed in a chamber a light source connected to the light source set support; a vacuum chuck installed below the light source for supporting at least one wafer having a protective tape attached to its front side by an adhesive; and a reflector surrounding the light source and arranged to concentrate UV rays generated from the light source onto said vacuum chuck;

an adjustable first means installed between the chamber and the light source set support and for moving the light source set support; and an adjustable second means installed between the light source set support and the light source for moving the light source up and down, wherein said adjustable first and second means provide for positioning and adjusting of said light source at a desired position with respect to the vacuum chuck.

According to the second embodiment of the present invention, the distance between the light source and wafer and the position of the light source are appropriately controlled so that the UV irradiation quantity on the wafer can be controlled to facilitate and expedite completely removing the adhesive ability of the protective tape to adhere to the wafer.

To accomplish the above object, a third embodiment of the present invention further provides a UV irradiation apparatus comprising a light source set support installed in a chamber, a light source connected to the light source set support, a vacuum chuck installed below the light source for supporting wafers having a protective tape attached on its front side by an adhesive layer, and a reflector surrounding the light source and adapted to concentrate UV rays generated from the light source onto the vacuum chuck, wherein the reflector reflects UV rays while permitting only visible and infrared rays to pass through it and escape.

According to the third embodiment of the present invention, to maximize a chemical reaction in the adhesive layer of the protective tape and cause a loss of the adhesive property of the adhesive, substantially only UV rays are irradiated onto the front side of the wafer rather than a combination of UV rays together with visible rays and infrared rays which can generate heat.

To accomplish the above object, a fourth embodiment of the present invention still further provides a UV irradiation apparatus comprising a light source installed in a chamber, a wafer transferor portion installed below the light source for moving the wafer having a protective tape attached to its front side by an adhesive layer, a reflector surrounding the light source and adapted to concentrate UV rays generated from the light source onto the wafer transferor, wherein the wafer transferor portion comprises:

a vacuum chuck arranged for supporting said wafers, and a vacuum chuck driver located under the vacuum chuck and arranged for enabling the vacuum chuck to move up and down with respect to said light source and to rotate said wafer upon a first axis positioned at a predetermined distance from a center of the vacuum chuck while at the same time moving said wafer moving straight in a horizontal direction.

According to the fourth embodiment of the present invention, concentration of irradiated UV rays to primarily the central part of the wafer can be prevented so that UV rays are uniformly irradiated on the whole surface of the wafer because the vacuum chuck rotates around a center of a first axis at a predetermined position from the center of the vacuum chuck while moving straight in a horizontal direction.

To accomplish another object, in a preferred embodiment of the present invention, there is provided a UV irradiation apparatus comprising a light source installed in a chamber, a wafer transferring means installed below the light source in order to move the wafer having a protective tape attached to its front side by an adhesive, and a reflector surrounding the light source adapted to concentrate UV rays generated from the light source on the wafer transferring means, wherein the wafer transferor portion comprises:

a table containing a heater for heating the wafer;

a buffer on a portion of the table in which to keep the wafer after completion of UV irradiation;

a wafer fixing portion for intercepting the wafers transferred from the buffer in a predetermined position of the table adjacent to the buffer, and fixing the intercepted wafers, and then for eliminating the protective tape: and a wafer array portion for arranging the wafer transferred from the wafer fixing portion in a predetermined position of the table adjacent to the wafer fixing portion.

According to the preferred embodiment of the present invention, the wafer which is heated during UV ray irradiation can gradually cool down by heaters contained in the buffer and the wafer fixing portion. Accordingly, the protective tape attached to the front side of the wafer can be completely eliminated from the wafer. Also, it is possible to prevent damaging the wafer when the wafer is transferred to a carrier by arranging the wafer on a predetermined position using the wafer array portion.

BRIEF DESCRIPTION OF THE DRAWINGS

The above objects and advantages of e present invention will become more apparent by describing in detail a preferred embodiment thereof with reference to the attached drawings in which:

FIG. 1 is a front view of a UV irradiation apparatus according to a first embodiment of the present invention;

FIG. 2 is a side view of the UV irradiation apparatus according to the first embodiment of the present invention;

FIG. 3 is a perspective view of a heating block of FIG. 1;

FIG. 17 is a schematic view of the UV irradiation apparatus including a wafer transferring means according to the fourth embodiment of the present invention;

DETAILED DESCRIPTION OF THE INVENTION

Figure 5:
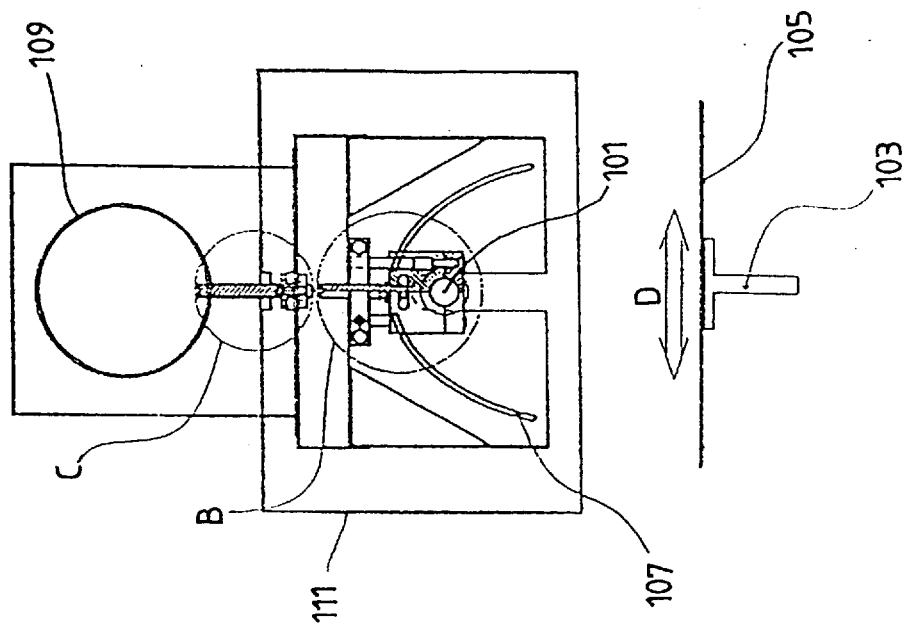
FIG. 5 is a side view of the UV irradiation apparatus according to the second embodiment of the present invention.

Preferred embodiments will be in detail described referring to accompanying drawings.

Embodiment 1

FIGS. 1 through 3 are views for illustrating a UV irradiation apparatus according to a first embodiment of the present invention.

FIG. 1 is a front view of a UV irradiation apparatus according to the first embodiment of the present invention. Here, reference numeral 1 denotes a UV lamp for generating UV rays, 3 denotes a wafer located under UV lamp 1 having a protective tape attached to its front side by an adhesive layer, 5 denotes a vacuum chuck for supporting wafer 3, 7 denotes a reflector surrounding UV lamp 1 for concentrating UV rays generated by the UV lamp 1 to wafer 3, 9a and 9b are heat radiation plates installed at both sides of the vacuum chuck 5 and having the uneven upper surface for radiating much heat, 11a and 11b denote adiabatic plates attached to each of the two radiation plates 9a and 9b for intercepting heat. In this apparatus, adiabatic plates 11a and 11b attached to the lower side of radiation plates 9a and 9b and the side walls opposite to vacuum chuck 5 serve to transfer most of heat emitted from radiation plates 9a and 9b to the wafer on the radiation plates.

13a and 13b denote heaters for generating heat, 15a and 15b denote holes formed on the sidewalls of radiation plates 9a and 9b in order to install heaters 13a and 13b therein, and 17 denotes an outlet for discharging gas such as nitrogen gas transferred into around UV lamp 1. Reference character "A" denotes a route of the nitrogen gas flowing to the exterior through outlet 17. Here, heaters 13a and 13b are made in order that a temperature can be controlled.

In the UV irradiation apparatus according to the present invention, radiation plates 9a and 9b, adiabatic plates 11a and 11b, heaters 13a and 13b, and holes 15a and 15b formed on the side walls of the radiation plates form a heating block according to the present invention and are detachable.

FIG. 2 is a side view of the UV irradiation apparatus shown in FIG. 1 according to the present invention. The reference numerals of this figure which are the same as those of FIG. 1 denote the same portions as described in FIG. 1.

According to FIG. 2, reference numeral 5a shows a state of moved vacuum chuck 5. That is, vacuum chuck 5 should be movable in order to carry wafer 3 to a position to be exposed to UV rays and to remove the wafer from the irradiation exposure position after completion of UV irradiation. Accordingly, two heating blocks are separated by a predetermined distance as shown in FIG. 1 which enable vacuum chuck 5 to horizontally move through the space therebetween.

FIG. 3 is a perspective view showing heating blocks according to the present invention. The two heating blocks are separated by a predetermined interval therebetween. The predetermined interval is a space provided in order that a vacuum chuck can move therein. The upper surfaces of each heating block are formed to be uneven surfaces to permit much heat to radiate upwards.

As described above, the UV irradiation apparatus according to the first embodiment of the present invention keeps the wafer at a predetermined temperature after UV irradiation so as to avoid suddenly cooling it down. This is accomplished by installing temperature-controllable heating blocks at both sides of the vacuum chuck. Accordingly, an adhesive layer of a protective tape attached to the front side of the wafer is chemically reacted under an optimum condition such that the protective tape is easily eliminated.

Embodiment 2

FIGS. 4 through 8 are views for illustrating a UV irradiation apparatus according to a second embodiment of the present invention. In these figures, like reference numerals and reference characters denote identical parts, and description therefor will be omitted.

Figure 4:
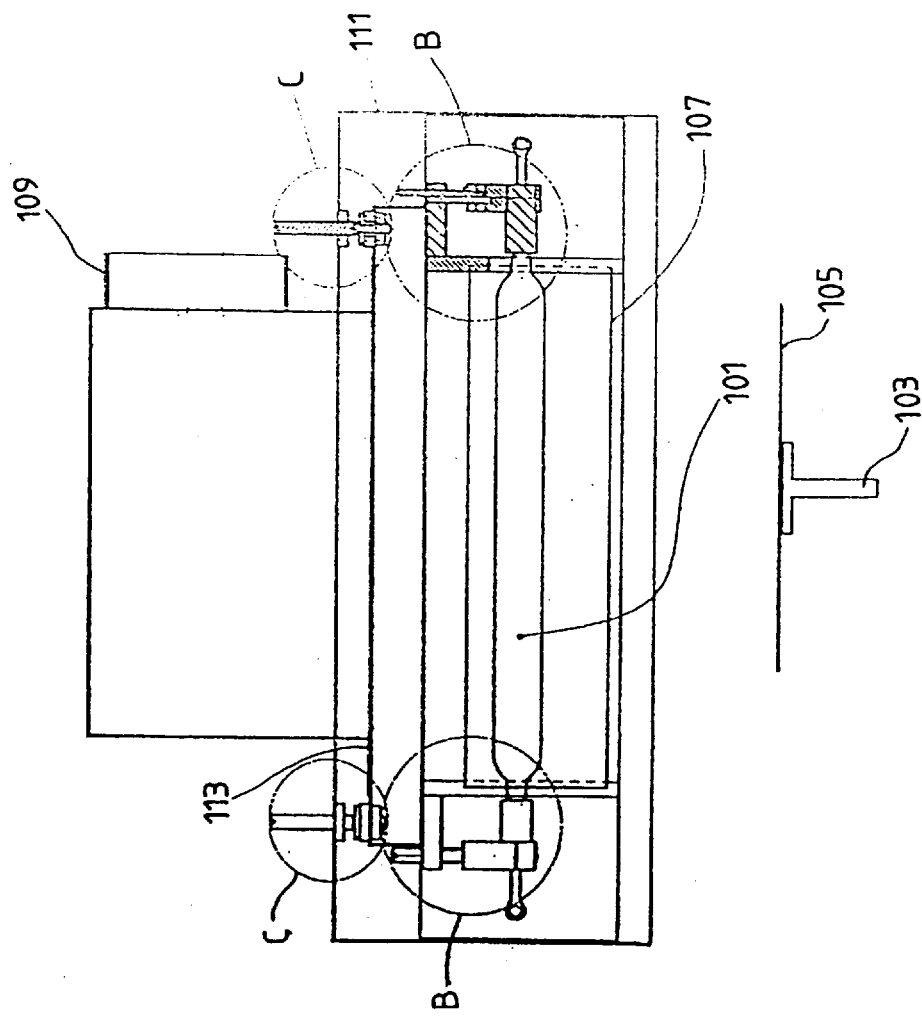
FIG. 4 is a front view of a UV irradiation apparatus according to a second embodiment of the present invention.

FIG. 4 is a front view of the UV irradiation apparatus according to the second embodiment of the present invention. Reference numeral 111 denotes a chamber, 101 denotes a light source installed in chamber 111, 103 denotes a vacuum chuck installed under light source 101, 105 denotes a wafer supported by vacuum chuck 103 and having a protective tape attached to its front side by an adhesive layer, 107 denotes a reflector installed for surrounding light source 101 in order to concentrate light generated from light source 101 onto vacuum chuck 103, i.e., on wafer 105, 109 denotes an outlet for discharging heat generated in chamber 111, and permitting air and nitrogen gas to flow into chamber 111 and to the exterior, and 113 denotes a light source set support for supporting light source 101. A portion shown in a circle represented with "C" denotes a first means installed between chamber 111 and light source set support 113 for moving light source set support 113 up and down, and a portion shown in a circle represented with "B" denotes a second means installed between light source set support 113 and light source 101 for fine moving light source 101 up and down.

FIG. 5 is a side view of the UV irradiation apparatus shown in FIG. 4 according to the second embodiment of the present invention.

Referring to FIG. 5, reflectors 107 obliquely installed around both sides of light source 101 serve to concentrate light generated from light source 101 on the wafer therebelow. An arrow "D" denotes a movement direction of vacuum chuck 103 produced in order that wafer 105 can be supported thereon by applying a vacuum source.

Figure 6:
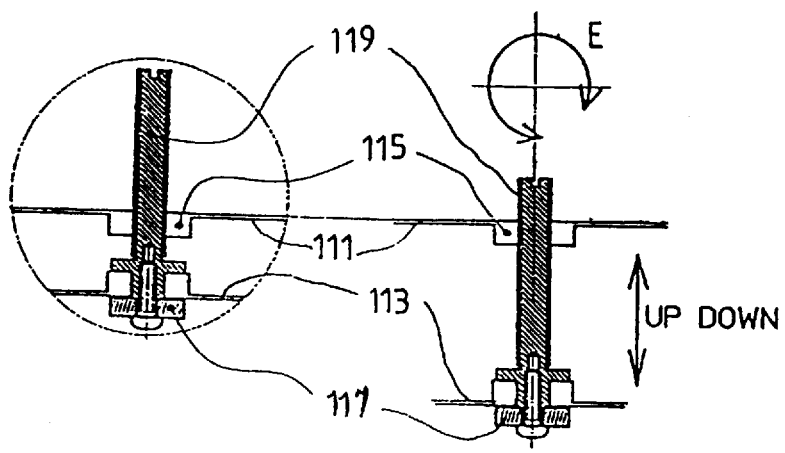
FIG. 6 is an enlarged view of a "C" portion of FIG. 4.

FIG. 6 shows an enlarged view of a portion "C" of FIG. 4, that is, of a first adjustable movement means.

Referring to FIG. 6, reference numeral 111 denotes a part of chamber 111 shown in FIGS. 4 and 5, 115 denotes a first nut installed in chamber 111, 119 denotes a first lead screw inserted in first nut 115 for rotating, 113 denotes a part of light source set support 113 of FIG. 4 connected to the lower portion of first lead screw 119, and 117 denotes a light source set fixing block for fixing light source set support 113 at the lower portion of first lead screw 119. In this figure, the first means shown in a circle denotes an up-state position of light source set supporter 113, the first means shown at the circle's right denotes a down-state position of light source set support 113. The operation of up- and down-movement of light source set support 113 is enabled by rotating first lead screw 119 to the arrowed direction "E".

Figure 7:
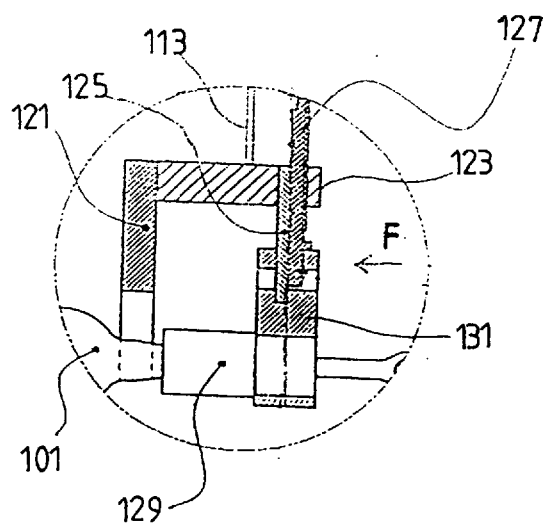
FIG. 7 is an enlarged view of a "B" portion of FIG. 4.

FIG. 7 shows an enlarged view of "B" of FIG. 4, i.e., the second adjustable light source movement means.

Referring to FIG. 7, reference numeral 101 denotes a light source of FIG. 4, 113 denotes a part where extended light source set support 113 of FIG. 6 is bent in a vertical direction, 123 denotes a fixing block connected to light source set support 113 and provided with a second nut, 121 denotes a fixing block arm for supporting fixing block 123, 127 denotes a second lead screw inserted in the second nut of fixing block 123 and for rotating, 131 denotes a light source socket support block connected to the lower portion of second lead screw 127, 125 denotes a fixing pin having the one end fixed on fixing block 123, and the other end inserted in a groove formed on light source socket support block 123 and for preventing light source socket support block 131 from rotating while second lead screw 127 rotates, and 129 denotes a light source socket fixed in light source socket support block 131 and for inserting light source 101.

Figure 8:
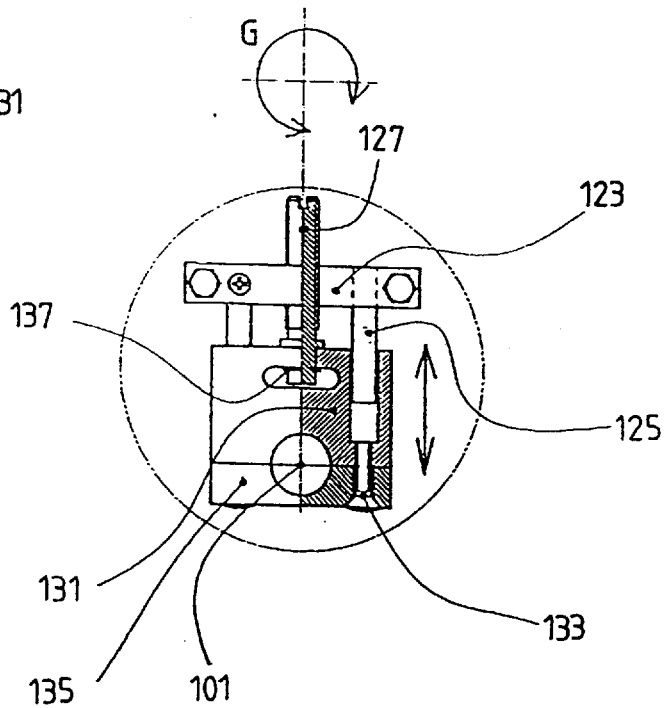
FIG. 8 is a side view of FIG. 7.

FIG. 8 is a view viewed from the right, that is, a side view viewed in a direction of an arrow "F" of the second adjustable movement means shown in FIG. 7.

Referring to FIG. 8, reference numeral 135 denotes a light source socket fixing block for fixing light source socket 129 where light source 101 can be inserted in light source socket support block 131, 133 denotes a bolt for fixing light source socket fixing block 135 by being stuck to light source socket support block 131, and 137 denotes a washer for preventing second lead screw 127 from seceding from light source socket support block 131. Here, second lead screw 127 can be controlled by rotating in a direction of "G" so that light source 101 can be fine moved up and down.

According to the second embodiment of the present invention as described above, the height of the light source can be controlled by installing first means represented with "C" of FIG. 4 and second means "B" thereof between the chamber and the light source set supporter and between the light source set support and the light source, respectively. Accordingly, the quantity of UV irradiation on a wafer can be appropriately controlled so that a chemical reaction of an adhesive in the adhesive layer for attaching the wafer and the protective tape to each other can be maximized. As the result, the protective tape can be easily eliminated.

Embodiment 3

Figure 9:
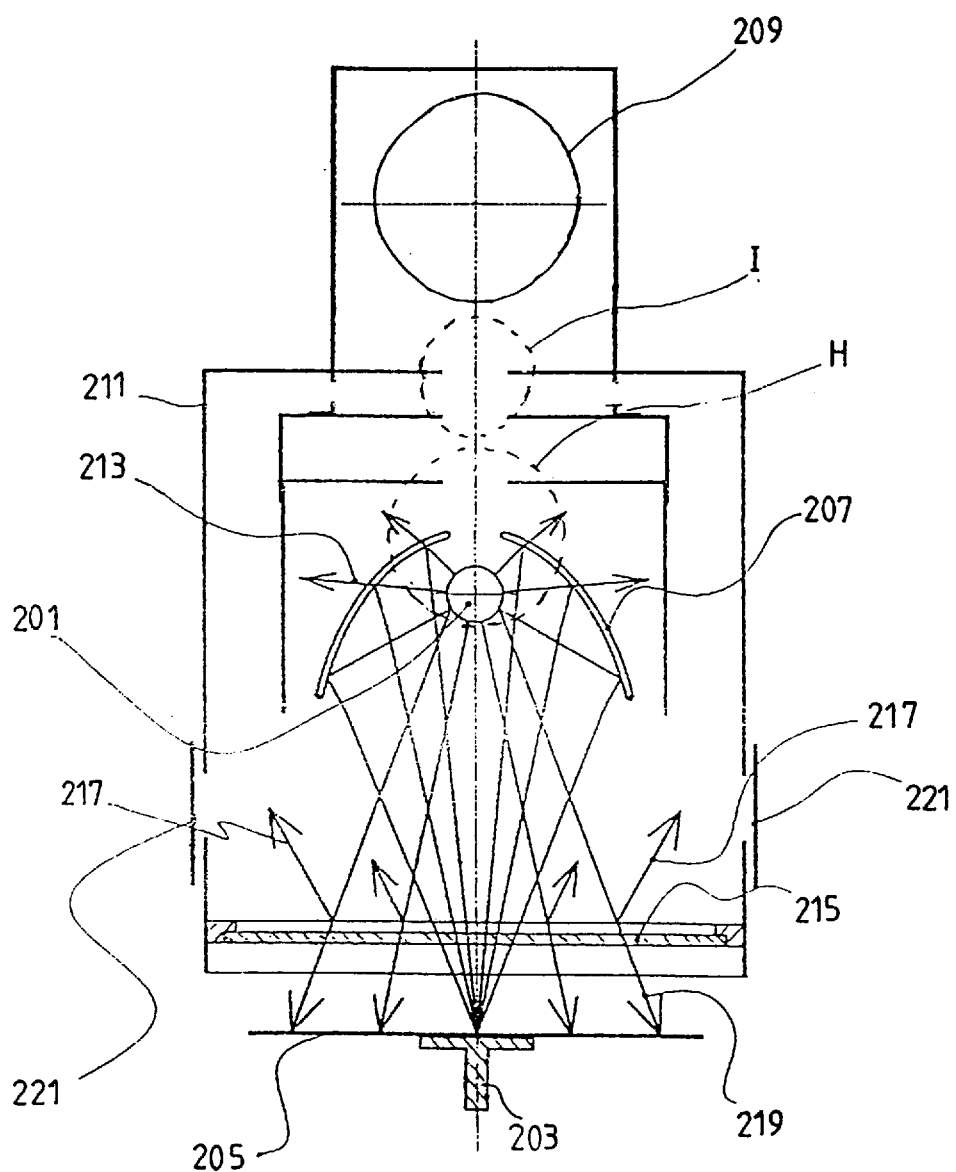
FIG. 9 is a side view of a UV irradiation apparatus according to a third embodiment of the present invention.
Figure 10:
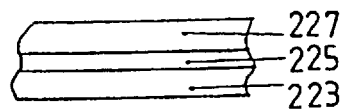
FIG. 10 is a sectional view enlarging the wafer of FIG. 9.
Figure 11:
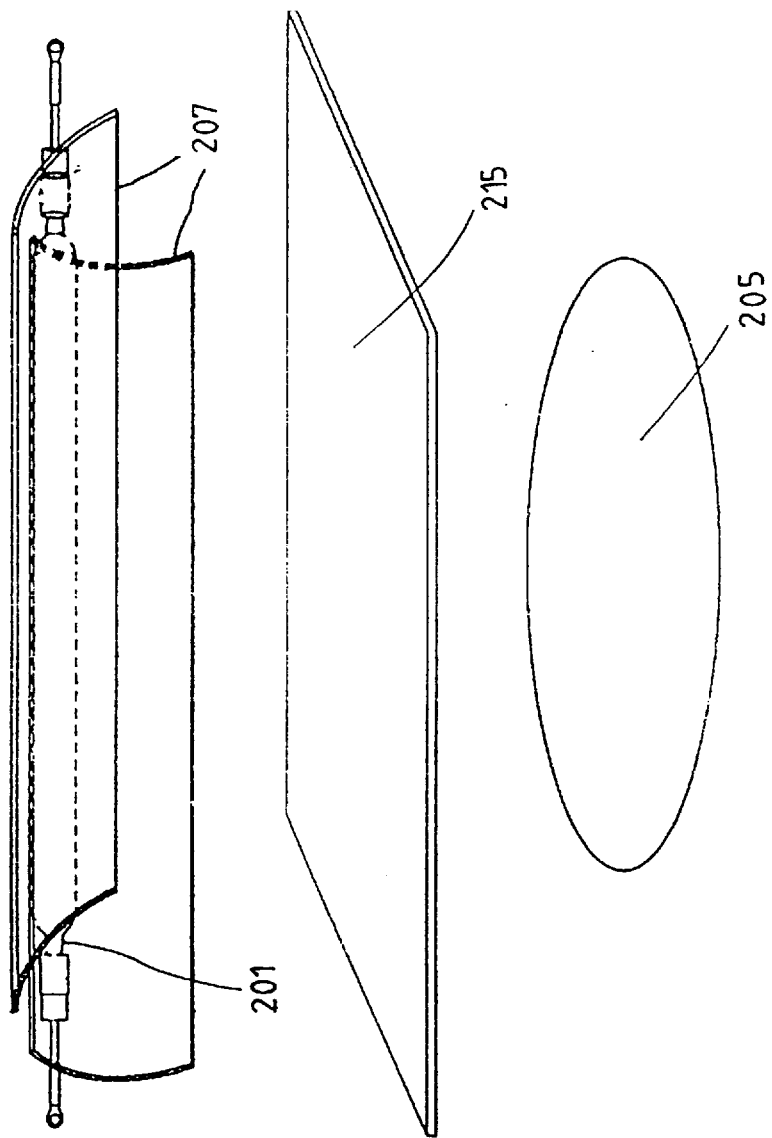
FIG. 11 is a perspective view showing main components of FIG. 9.

FIGS. 9 through 11 are views for illustrating a UV irradiation apparatus according to a third embodiment of the present invention. In these figures, like reference numerals and reference characters denote identical parts, and description therefor will be omitted.

FIG. 9 shows a side view of the UV irradiation according to the third embodiment of the present invention, reference numeral 211 denotes a chamber, 201 denotes a light source installed in chamber 211 and generating not only UV rays but also infrared and visible rays, 205 denotes a wafer located under light source 201 and having the front side, that is, the upper surface upon which a protective tape is attached by an adhesive layer, 203 denotes a vacuum chuck for supporting wafer 205, 207 denotes a UV reflector surrounding both sides and the upper portion of light source 201 in order that wafer 205 is irradiated with UV rays, and 213 denotes, out of various rays generated from light source 201, visible and infrared rays passing through UV reflector 207. In this figure, UV reflector 207 is produced by coating the one surface of a heatproof glass, i.e., a surface facing to light source 201 with a plurality of a first special material layers. It is preferable that the first special material layers are formed by alternately depositing layers of $TiO_2$ and of $SiO_2$.

Subsequently, reference numeral 215 denotes a UV filter installed between light source 201 and wafer 205, and for transferring UV rays but reflecting infrared and visible rays, 217 denote infrared and visible rays reflected by UV filter of incident rays from light source 201, 219 denote infrared rays arriving at wafer 205 through UV filter 215, 221 denotes an inlet panel for intercepting light from the exterior while maintaining a predetermined interval to chamber 211 in order that air flows into chamber 211, and 209 denotes an outlet installed above chamber 211 which is for discharging the air inhaled in chamber 211. Herein, UV filter 215 is produced by coating the one side of a heatproof glass, i.e., a surface facing to the light source with a plurality of second special material layers. It is preferable that the second special material layers are formed by alternately depositing $ZrO_2$ and $SiO_2$ layers. Further, with appropriate control of an interval between light source 201 and wafer 205 by further installing first means "B" and second means "A" of the second embodiment of the present invention correspondingly at the positions denoted as "I" and "H", a chemical reaction of an adhesive in the adhesive layer can be maximized in order that the adhesive serving to attach a protective tape to the front side of wafer 205 completely loses its ability to adhere to said wafer.

FIG. 10 is a sectional view in detail showing wafer 205. Reference numeral 223 denotes a silicon substrate where a semiconductor device is formed, 227 denotes a protective tape for protecting the semiconductor device formed on the front side of a silicon substrate 223 when the back side thereof is back-ground, and 225 denotes an adhesive for attaching silicon substrate 223 and protective tape 227 to each other.

FIG. 11 is a perspective view showing main portions of FIG. 9, and shows a structure for efficiently irradiating UV rays generated from light source 201 to wafer 205 by UV reflector 207 and UV filter 215.

According to the third embodiment of the present invention, infrared rays generating heat are prevented from being irradiated on a wafer having a protective tape attached to its front side by an adhesive layer. Thus, it is easy to eliminate the protective tape, since the difference between the temperature of the wafer being irradiated in said UV irradiation apparatus by UV rays and an ordinary external temperature can be reduced.

Embodiment 4

FIGS. 12 through 20 are views for illustrating the one wafer transferor of a UV irradiation apparatus according to a fourth embodiment of the present invention. In these figures, like reference numerals and reference characters denote identical parts, and description therefor will be omitted.

Figure 12:
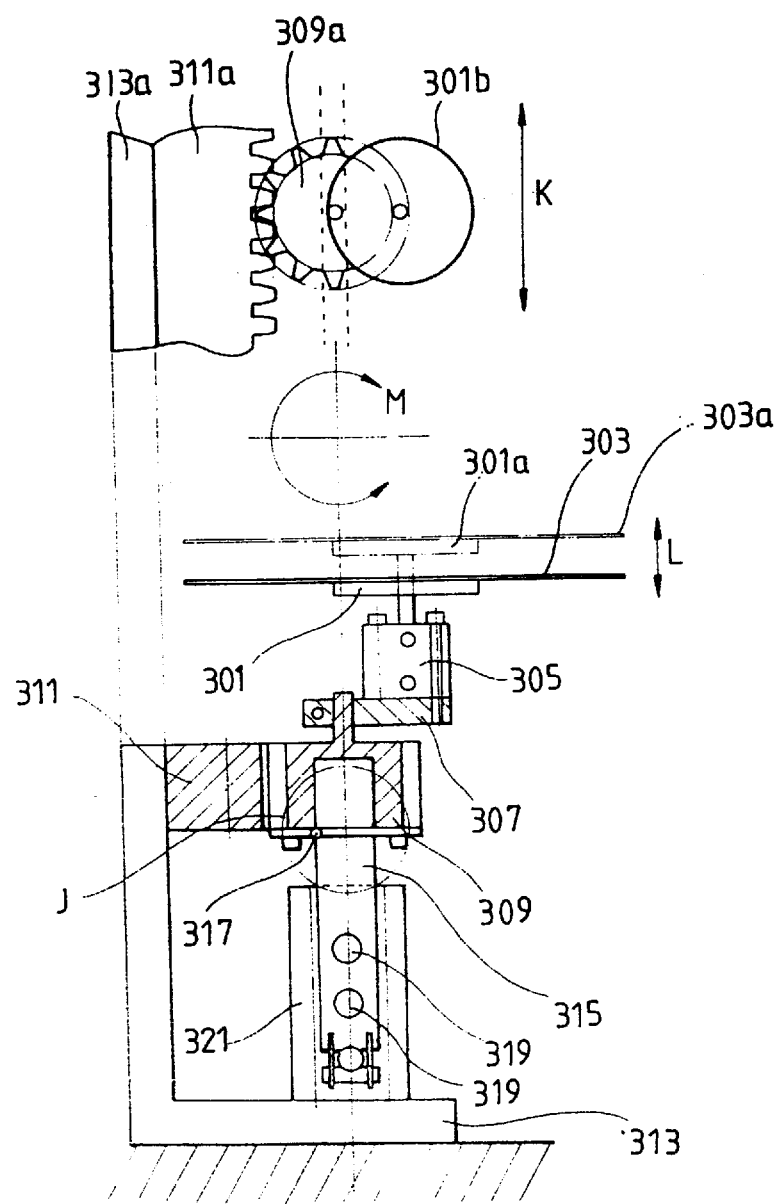
FIG. 12 shows a plan view of a wafer transferring means according to a fourth embodiment of the present invention and a sectional view thereof.

FIG. 12 shows a front view of a wafer transferor according to the present invention and a partial plan view thereof.

Referring to FIG. 12, reference numeral 301 denotes a vacuum chuck, 303 denotes a wafer supported by vacuum on vacuum chuck 301, 305 denotes a cylinder portion connected to a central axis of vacuum chuck 301 and for moving vacuum chuck 301 up and down in a direction of an arrow "L", 307 denotes a cylinder fixing block fixed by attaching to the bottom of cylinder portion 305 and protruding from the one side of cylinder portion 305, 309 denotes a pinion gear fixed by being connected to cylinder fixing block 307 protruded from the one side of cylinder portion 305, 311 denotes a rack gear of a linear type installed in order to be in gear with pinion gear 309, and 313 denotes a rack fixing block for fixing rack gear 311. Herein, pinion gear 309 has a central portion of the bottom where a groove is roundly formed. Further, cylinder portion 305 has a function of moving vacuum chuck 301 up and down where wafer 303 lies so that wafer 303 can be loaded from a cassette (not shown) to a UV irradiation apparatus or unloaded from the UV irradiation apparatus to the cassette (not shown).

Reference numerals 301a and 303a denote a state that vacuum chuck 301 and wafer 303 are moved up by cylinder portion 305, respectively, and 301b, 309a, 311a, and 313a denote plan views of vacuum chuck 301, pinion gear 309, rack gear 311, and rack fixing block 313, respectively. Herein, rack gear 311a is fixed by the rack fixing block 313, pinion gear 309a can linearly move in a direction of an arrow "K" while rotating in gear with rack gear 311a. Also herein, a central axis of pinion gear 309 is positioned eccentrically to a central axis of vacuum chuck 301b, that is, concentric to the center of wafer 303. Accordingly, when pinion gear 309 rotates along the arrow "M", wafer 303 moves in a direction "K" simultaneously making circular movement.

Subsequently, reference numeral 315 denotes a pinion gear support with its upper portion inserted in a groove of a round form formed in the bottom of pinion gear 309 for supporting pinion gear 309, its middle portion having a groove formed around it, and its lower portion having a plurality of holes passing through in the direction K, 317 denotes a planar washer fixed to the bottom of pinion gear 309 from deviating from pinion gear support 315, and where planar washer 317 is also inserted and inserted in the hole formed around the middle portion of pinion gear support 315, 319 denote shafts inserted in a plurality of holes passing through the lower portion of pinion gear support 315 in the direction K and serving to a rail on which pinion gear support 315 can horizontally move, and 321 denotes a shaft fixing block connected to both ends of shaft 319 for fixing shafts 319.

Figure 13:
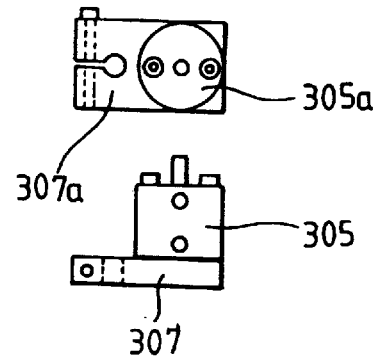
FIG. 13 shows a plan view of the cylinder portion and the cylinder fixing block of FIG. 12 and a sectional view thereof.

FIG. 13 shows a sectional view of cylinder portion 305 of and the cylinder fixing block 307 of FIG. 12, and a plan view thereof. Reference numeral 305a is a plan view of cylinder portion having a round form shown from the top, 307a is a plan view of cylinder fixing block 307 fixed by being attached to the bottom of cylinder portion 305. Cylinder fixing block 307a is formed at a protrusion from the one end of cylinder portion 305a.

Figure 14:
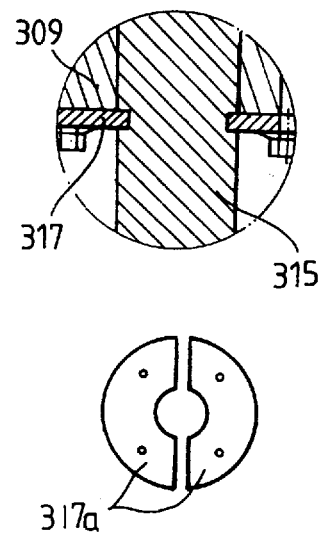
FIG. 14 is an enlarged view of a "J" portion of FIG. 12 and a plan view of the plan washer thereof.

FIG. 14 shows an enlarged view of a portion "J" of FIG. 12 and a plan view of planar washer 317. Herein, reference numeral 317a is a plan view of planar washer 317. Planar washer 317 in the form of a ring can be inserted in the groove around the middle portion of the pinion gear support 315 while fixed to the bottom of the pinion gear 309 so that pinion gear 309 can rotate without being deviated from pinion gear support 315.

Figure 15:
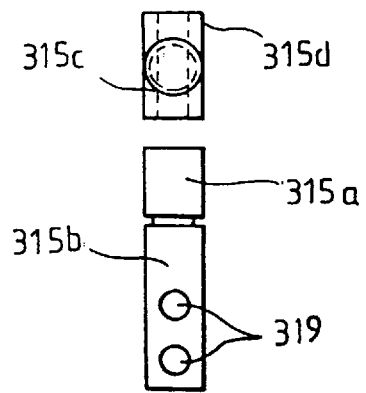
FIG. 15 is a plan view showing the pinion gear support of FIG. 12 and a sectional view thereof.

FIG. 15 is a plan view showing the pinion gear support 315 of FIG. 12 and a sectional view thereof. Reference numeral 315a denotes the upper portion of pinion gear support 315 and a portion to be inserted in the groove formed in the bottom of pinion gear 309, 315b denotes the lower portion of pinion gear support 315 where shafts 319 pass through. Herein, a groove formed between the upper portion 315a of pinion gear support 315 and the lower portion 315b thereof is a portion where planar washer 317 is to be inserted. 315c and 315d denote plan views of the upper and lower portions 315a and 315b of pinion gear support 315 viewed from the top.

Figure 16:
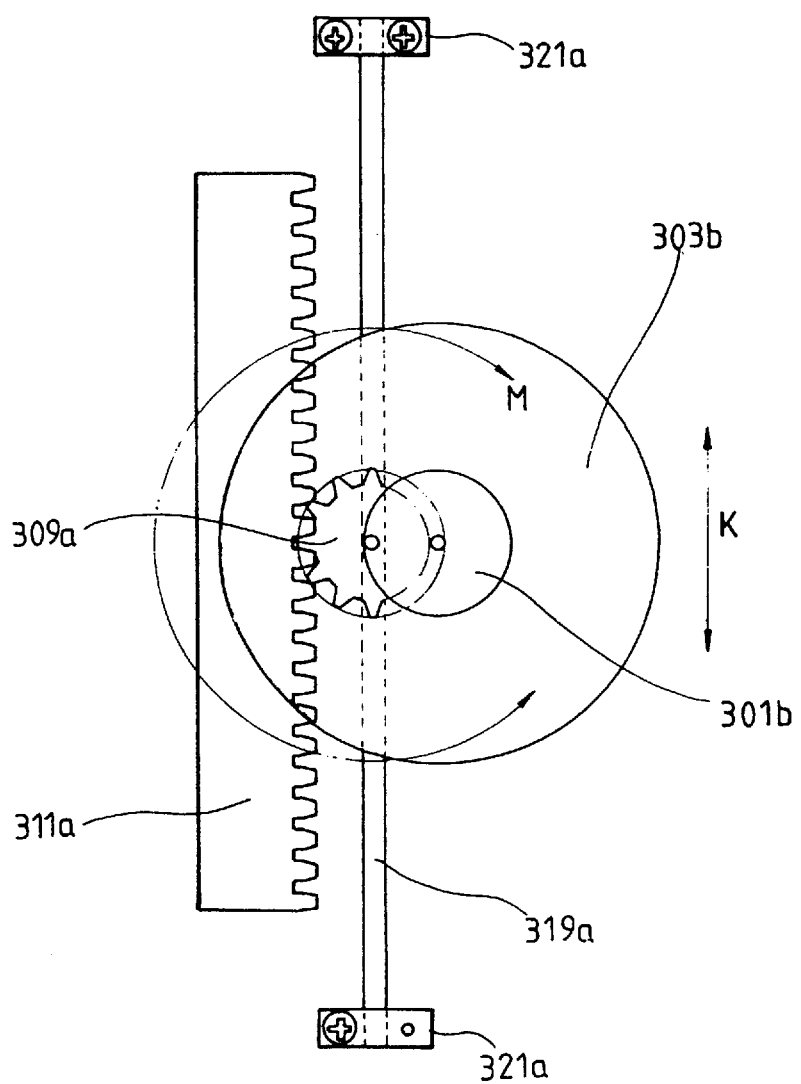
FIG. 16 is a detail view of the plan view showing the wafer transferor of FIG. 12.

FIG. 16 is a plan view of components of a UV irradiation apparatus having a wafer transferor according to the fourth embodiment of the present invention, reference numeral 301b denotes plan views of a vacuum chuck 301, 303b denotes a plan view of supported wafer 303 on vacuum chuck 301b, 309a denotes a plan view of pinion gear 309 having a central axis in a predetermined distance from a central axis of vacuum chuck 301b, 311a denotes a plan view of a rack gear 311 of a linear type installed for being in gear with pinion gear 309a, 319a denotes a plan view of shafts 319 serving as rails where pinion gear 309a can move straight in a direction of an arrow "K", and 321a denotes a shaft fixing block connected to both ends of shaft 319a for fixing shafts 319a. Herein, when pinion gear 309a moves in a direction of an arrow "K", pinion gear 309a rotates. Accordingly, wafer 303b on vacuum chuck 301b connected to a central axis of pinion gear 309a also moves straight in the direction of "K" while rotating in the direction of an arrow "M". Also herein, the center of wafer 303b further moves in the direction of "K" while rotating.

FIG. 17 shows main components of the UV irradiation apparatus having the wafer transferor according to the fourth embodiment of the present invention. Reference numeral 303 denotes a wafer lying on vacuum chuck 301 of the wafer transferor illustrated in FIGS. 12 through 17, 331 denotes a light source installed above wafer 303, 335 denotes a UV filter installed between light source 331 and wafer 303 for transferring only UV rays out of various lights generated from light source 331 but reflecting infrared and visible rays thereof. Herein, UV filter 335 is formed by coating a plurality of special material layers on the one surface of a quartz substrate. It is preferable that the special material layers are formed by in turn accumulating $ZrO_2$ and $SiO_2$ layers. Accordingly, the infrared rays are prevented from being irradiated to wafer by UV filter 335. As the result, when UV rays are irradiated onto the wafer, its temperature maintains close to an ordinary external temperature so that, when a wafer is exposed to the atmosphere after UV irradiation, a sudden temperature change of the wafer can be prevented. This leads to the adhesive layer that was maintaining a state of adhesion on the wafer substantially completely losing its adhesive property, and thus, a protective tape can be easily eliminated. Reference numeral 333 denotes a general reflector installed for surrounding light source 331 in order to concentrate light generated from light source 331 on wafer 303. Herein, in the case that instead of reflector 333 UV reflector 207 illustrated in the third embodiment of the present invention is used, it is possible to maximize the efficiency of UV irradiation on wafer 303, and thus, the protective tape can be more easily eliminated.

Figure 18:
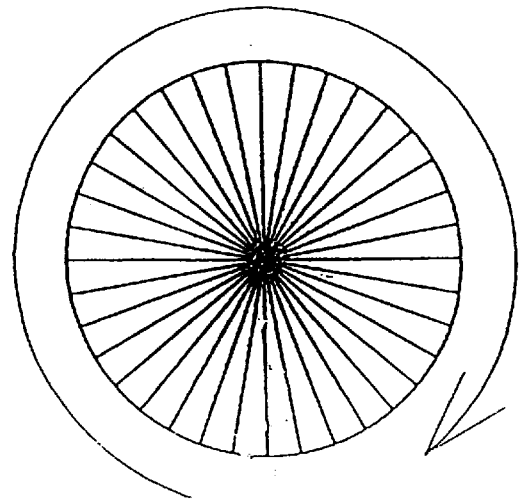
FIGS. 18 and 19 are views showing distribution of UV irradiation on a wafer by a conventional UV irradiation apparatus.
Figure 19:
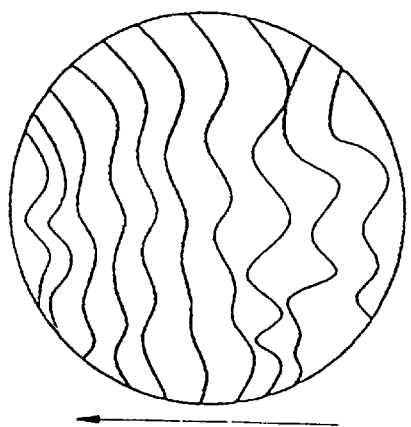
Figure 20:
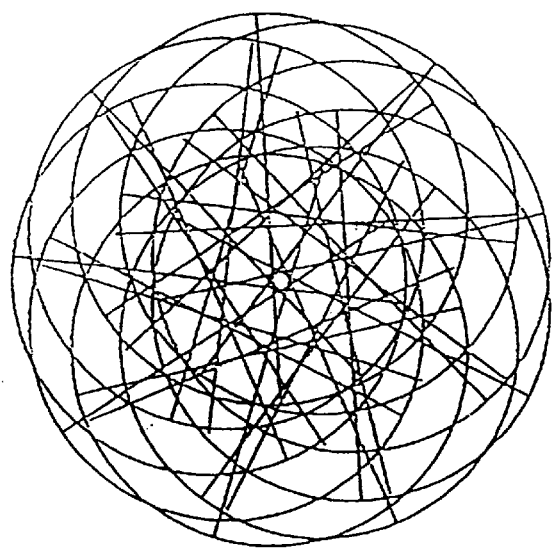
FIG. 20 is a view showing distribution of UV irradiation on a wafer when a UV irradiation apparatus including the one wafer transferor according to the fourth embodiment of the present invention is used.

FIGS. 18 and 19 are views showing distribution of UV irradiation on a wafer in the case that the conventional UV irradiation apparatus is used, FIG. 20 is a view showing distribution of UV irradiation on the wafer in the case that the UV irradiation apparatus having the one wafer transferor according to the fourth embodiment of the present invention is used.

FIG. 18 is a view showing distribution of UV irradiation on the wafer in the case that the wafer rotates on the center axis of the wafer. FIG. 19 is a view showing distribution of UV irradiation on the wafer in the case that the wafer only horizontally moves according to the wafer transferor by a roller. FIG. 18 shows a result that UV rays are irradiated concentratedly to the center part of the wafer, FIG. 19 shows a result that UV rays are unevenly irradiated on the whole surface of the wafer.

Next, FIG. 20 is a view showing distribution of UV irradiated on a wafer by the UV irradiation apparatus having a wafer transferor according to the fourth embodiment of the present invention. Therein, UV rays are uniformly irradiated on the whole surface of the wafer.

Figure 21:
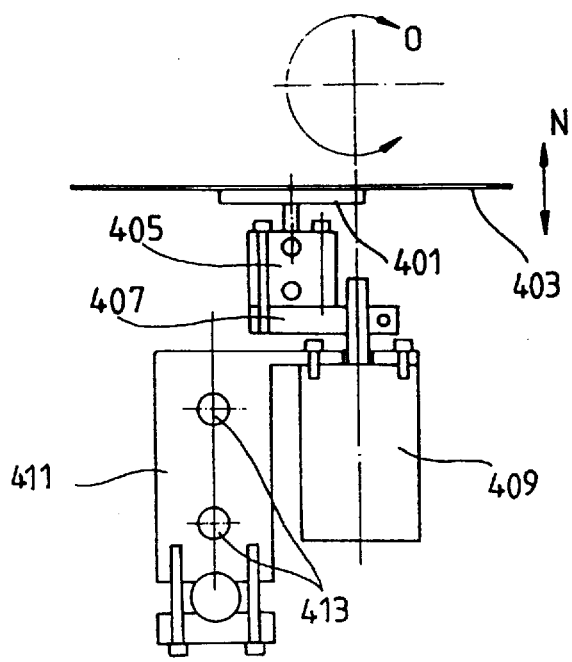
FIG. 21 is a front view of another wafer transferring means according to the fourth embodiment of the present invention.
Figure 22:
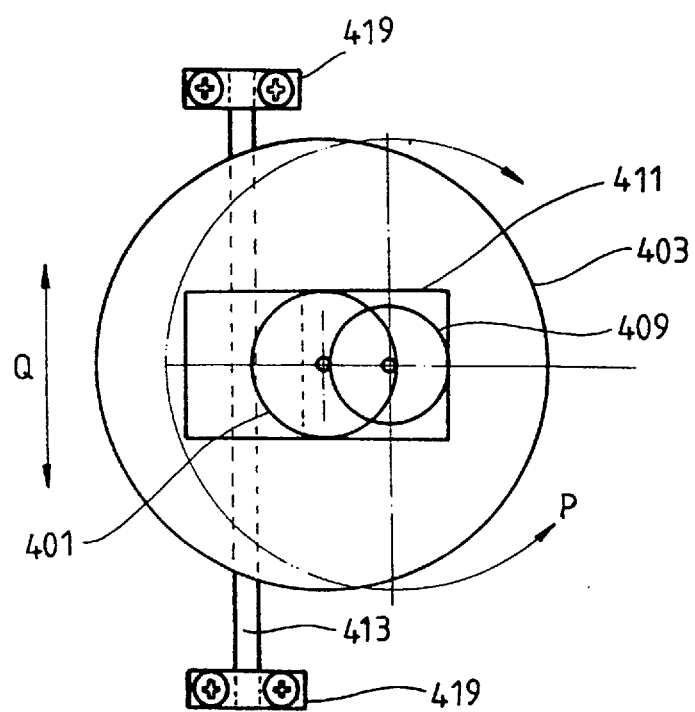
FIG. 22 is a plan view of FIG. 21.
Figure 23:
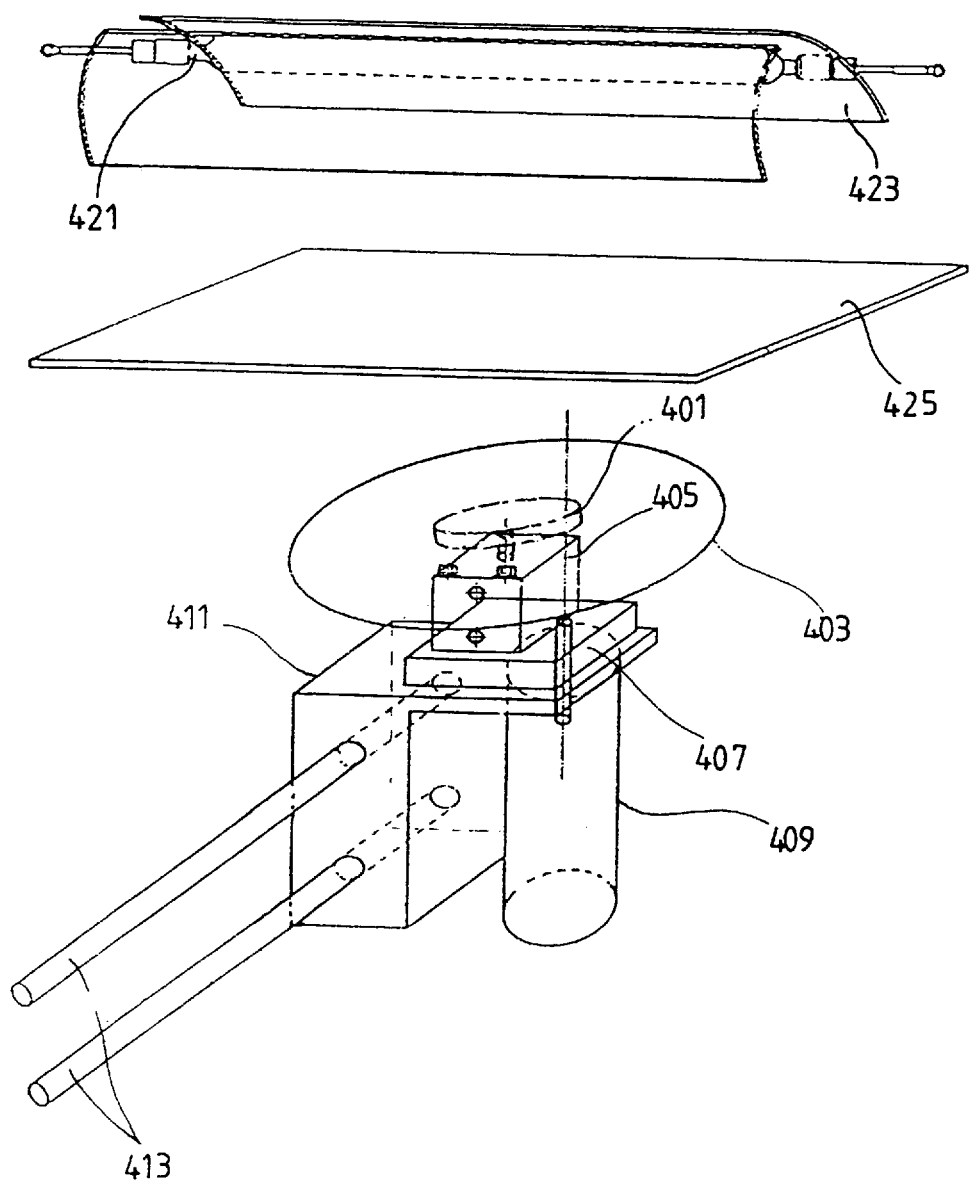
FIG. 23 is a perspective view of a UV irradiation apparatus including the other wafer transferor according to the fourth embodiment of the present invention.

FIGS. 21 through 23 are views for illustrating a UV irradiation apparatus having the other wafer transferor according to the fourth embodiment of the present invention. Herein, FIG. 21 is a front view of a wafer transferor according to the present invention and a partial plan view thereof. Referring to FIG. 21, reference numeral 401 denotes a vacuum chuck, 403 denotes a wafer supported by vacuum on vacuum chuck 401, 405 denotes a cylinder portion connected to a central axis of vacuum chuck 401 for moving vacuum chuck 401 in a direction of an arrow "N" up and down, 407 denotes a cylinder fixing block fixed by being attached to the bottom of cylinder portion 405 and protruded from the one side of cylinder portion 405, 409 denotes a power source fixed by connecting to the cylinder fixing block 407 protruded from the one side of cylinder portion 405 for rotating cylinder portion 405, and 411 denotes a power source fixing block connected to the upper portion of power source 409 for fixing power source 409. Here, it is preferable to use a motor for power source 409. Reference numeral 413 denotes a plurality of shafts passing through power source fixing block 411, so that power source fixing block 411 is able to move straight along shafts 413.

The wafer transferor formed as described above enables power source fixing block 411 to move straight simultaneously with the operation of power source 409, i.e., a motor, and thus, enables vacuum chuck 401 to move straight while rotating in an arrowed direction represented with "O". Accordingly, the central portion of wafer 403 also horizontally moves while rotating so that UV rays are prevented from being concentrated on the central portion of wafer 403 when UV rays irradiate. Cylinder portion 405 has a function to move up and down vacuum chuck 401 where wafer 403 lies so that wafer 403 can be loaded from a cassette (not shown) to a UV irradiation apparatus or unloaded to the cassette (not shown) from the UV irradiation apparatus.

FIG. 22 is a plan view of the wafer transferor of FIG. 21 viewed from the top. Reference numeral 419 denotes shaft fixing blocks attached to both ends of shaft 413 in order to fix a plurality of shafts 413. Herein, an arrow represented with "P" denotes a rotation direction of wafer 403. An arrow "Q" shows a horizontal direction that wafer 403 moves straight and also a direction that power source fixing block 411 moves along a plurality of fixed shafts 413.

FIG. 23 is a perspective view schematically showing a UV irradiation apparatus having a wafer transferor according to the present invention.

Referring to FIG. 23, reference numeral 421 denotes a light source installed in a chamber (not shown), 423 denotes a reflector installed for surrounding light source 421 in order to concentrate light generated from light source 421 on wafer 403 thereunder, and 425 denotes a UV filter installed between light source 421 and wafer 403 for passing only UV rays out of various rays generated from light source 421 and reflecting infrared and visible rays. Here, UV filter 425 prevents infrared rays from being irradiated on wafer 403 thereunder. Accordingly, an adhesive chemically reactive as a response to treatment with UV rays can be prevented from sudden cooling-down by restraining a rise in a temperature of an adhesive when UV rays are irradiated on wafer 403. As the result, after UV rays are irradiated, a protective tape can be smoothly eliminated from the wafer. This UV filter 45 is formed by coating a surface on the one side of a quartz substrate with a plurality of special material layers. Herein, it is preferable that the special material layers are formed by alternately depositing $ZrO_2$ and $SiO_2$ layers. Reference numeral 423 denotes a general reflector installed for surrounding light source 421 in order to concentrate light generated from light source 421 on wafer 403. Herein, in the case that UV reflector 207 described in the third embodiment of the present invention instead of reflector 423 is used, the efficiency of irradiating UV rays on wafer 403 can be maximized. Thus, the protective tape can be more easily eliminated from the wafer.

According to the fourth embodiment of the present invention as described above, UV rays can be uniformly irradiated on the whole surface of a wafer so that a chemical reaction of an adhesive distributed on the whole surface of the wafer can be maximized. Substantially only UV rays are allowed to irradiate the wafer by attaching both a UV reflector and a UV filter, or either the UV reflector or the UV filter. Thus, it is possible to provide a UV irradiation apparatus to smoothly eliminate a protective tape from a wafer.

Embodiment 5

Figure 24:
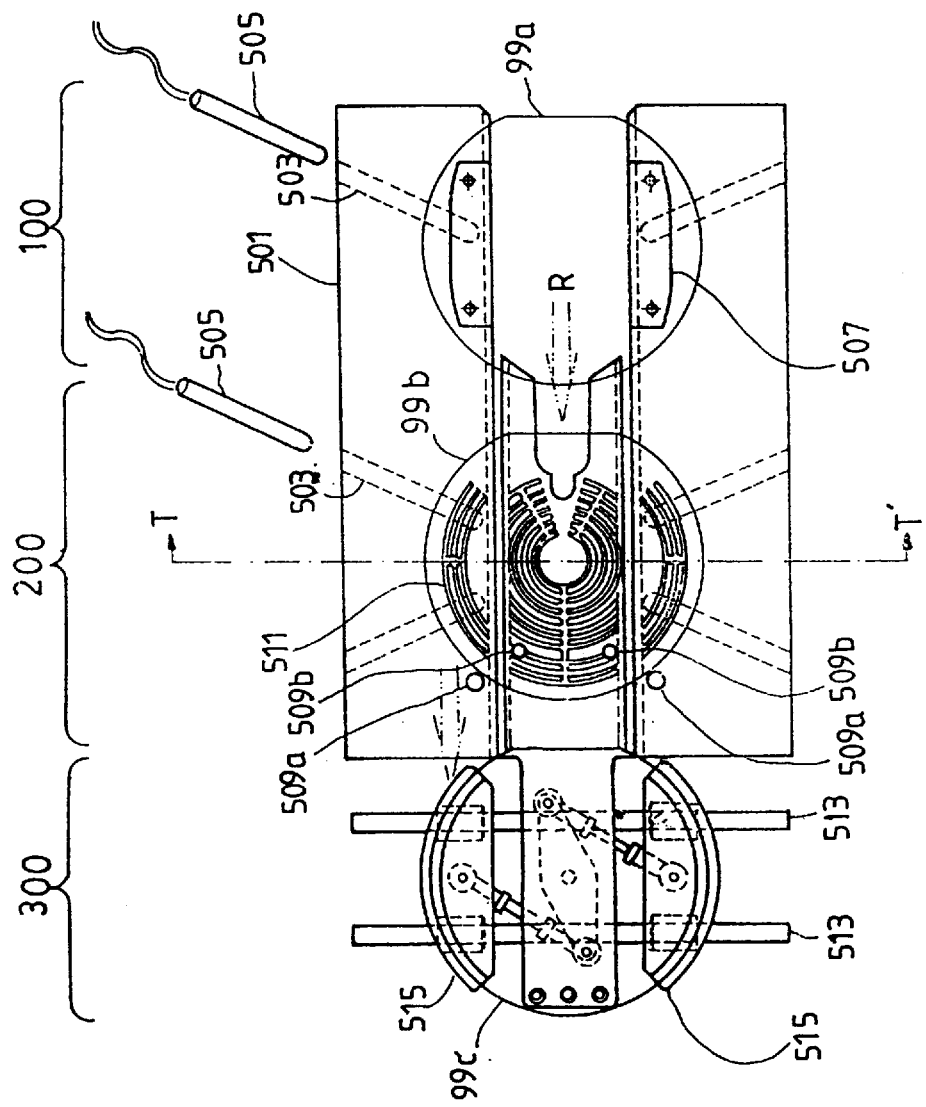
FIG. 24 is a plan view of a wafer transferring means according to a fifth embodiment of the present invention.
Figure 25:
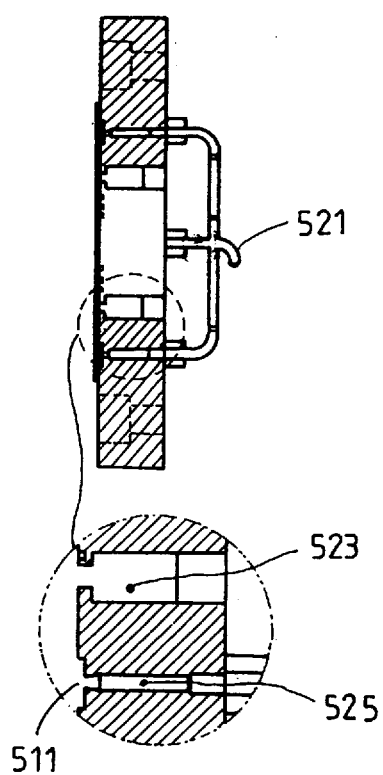
FIG. 25 is a sectional view taken along line "TT'" of FIG. 24 and an partially enlarged view thereof.
Figure 26:
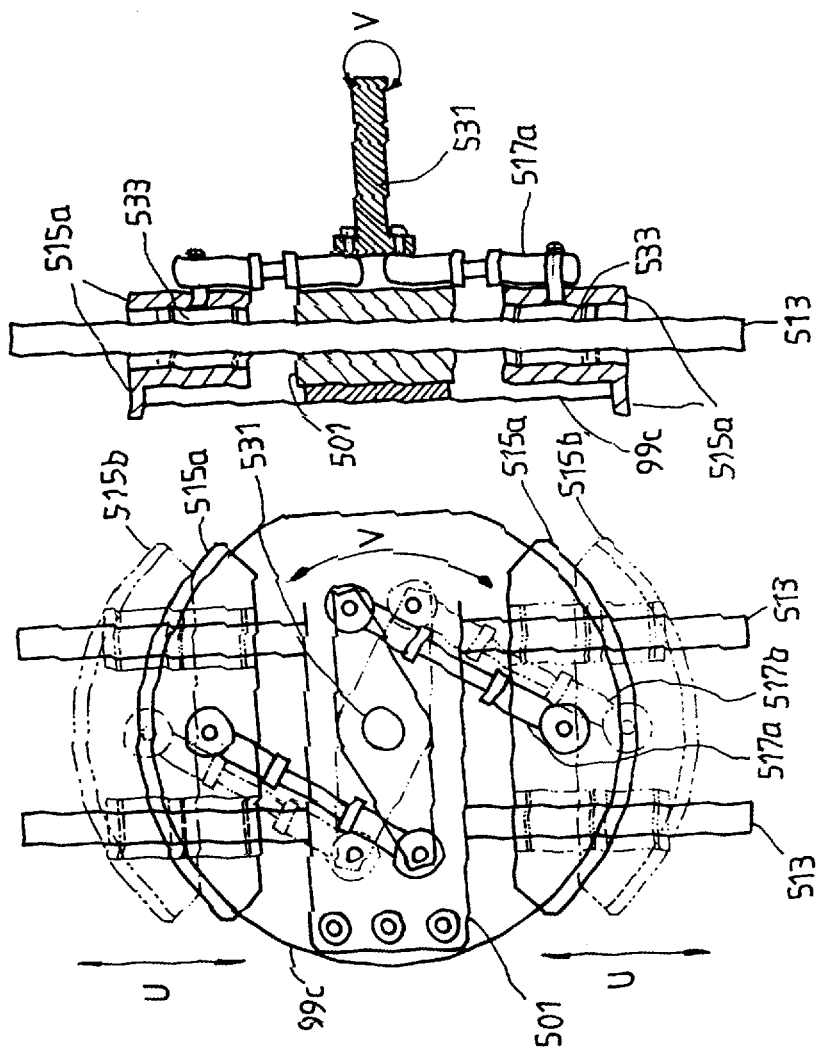
FIG. 26 shows a plan view of the wafer array portion of FIG. 24 and a side view thereof.

FIGS. 24 through 26 are views for illustrating a wafer transferor of a UV irradiation apparatus according to a fifth embodiment of the present invention. Herein, like reference numerals and reference characters denote identical parts, and description therefor will be omitted.

FIG. 24 is a plan view of the wafer transferor according to the present invention. Reference numeral 100 denotes a buffer for holding wafer 99a having the front side where a protection tape is attached after completion of UV irradiation for a predetermined period of time, 200 denotes a wafer fixing portion for intercepting wafer 99b transferred from buffer 100 in a direction of "R", fixing the intercepted wafer by vacuum, and then eliminating the protective tape, and 300 denotes a wafer array portion for arraying wafer 99c transferred in a direction of an arrow "S" from fixing portion 200 on a predetermined position.

Reference numeral 501 denotes a table where wafers 99a, 99b, and 99c lie, 503 denotes holes formed at both sides of table 501, 505 denotes a heater installed in hole 503, for heating the table 501. Therefore, a temperature of table 501 can be controlled by heater 505 so that a sudden decrease of a temperature of the wafer is prevented when a wafer hotter than an ordinary temperature during irradiation of UV rays moves on to table 501.

Subsequently, reference numeral 507 denotes a wafer support panel installed to protrude from a surface of the table in order to reduce an area where wafer 99a of buffer 100 contacts with table 501, 509a or 509b denote bar-shaped stoppers for stopping wafer 99b transferred to wafer fixing portion 200 in a predetermined position, by protruding from the surface of table 501 via holes passing at a predetermined portion of table 501. 511 denotes a groove formed on the surface of table 501 to be connected to a vacuum pump (not shown) in order to fix wafer 99b stopped by stopper 509a or 509b. Herein, stopper 509a or 509b is installed in different positions for stopping wafers of different diameters in a predetermined position. Therefore, wafers of a bigger diameter are selected by stopper 509a while wafers of smaller diameter are selected by stopper 509b.

Then, in wafer array portion 300, reference numeral 513 denotes a plurality of shafts fixed while passing through table 501 in a perpendicular direction to a direction of wafer 99b transferring from wafer fixing portion 200, and 515 denotes a pair of wafer holders installed on shaft 513 protruded from both sides of table 501 and sliding along shaft 513. Herein, wafer holders 515 broaden an interval therebetween by moving away from table 501 while wafers are transferred from wafer fixing portion 200. After transference of wafers is completed, wafer holders 515 move toward table 501 and arrange wafers on a predetermined position holding the wafers.

FIG. 25 shows a sectional view of wafer fixing portion 200 taken along line TT' of FIG. 24 and a partially enlarged view of the sectional view thereof.

Referring to FIG. 25, reference numeral 521 denotes a vacuum line installed in the back side of table 501 and connected to groove 511 formed on the surface of wafer fixing portion 200, 523 denotes a space formed for moving means (not shown) for transferring wafers on table 501, and 525 denotes a vacuum passage passing through table 501 for connecting groove 511 and vacuum line 521 to each other.

FIG. 26 shows a plan view of wafer array portion 300 of FIG. 24 and a side view thereof.

Referring to FIG. 26, reference numeral 515a denotes a state of arranging wafer 99c on a predetermined position by moving wafer holders 515 described in FIG. 24 closely to each other, 515b denotes a state where wafer holders move away from each other in order to make wafer 99c movable when wafer 99c is transferred.

Reference numeral 517a denotes an end load serving to transfer forces for wafer holder 515a to slide along shaft 513 by connecting to the bottom of wafer holder 515a, 517b shows the state of the end load connected to wafer holder 515b sliding away from each other so that the wafer 99C is able to move. Therein, an arrow represented with "U" denotes a movement direction of wafer holder 515.

Subsequently, reference numeral 531 denotes a wafer holder driving portion consisting of an arm connected to the other end of each end load 517a and a central axis for rotating the arm in a direction of an arrow "V", 533 denotes a slide bush installed for reducing frictional force generated while wafer holder 515a or 515b slides along shaft 513.

As described above, a UV irradiation apparatus having the wafer transferor according to the fifth embodiment of the present invention enables a UV irradiated wafer to be heated by heaters installed in the table of a buffer and a wafer fixing portion. Accordingly, it is possible to gradually cool a wafer having a temperature raised during a procedure of UV irradiation. As a result, a protective tape attached to the front side of the wafer by an adhesive layer can be easily detachable from the wafer. It is also possible to exactly load the wafer on a carrier by providing a wafer array portion for arranging the wafer to be in a predetermined position after the protection tape is eliminated. Therefore, damage caused by collision among wafer and carrier when loaded can be avoided.

According to the above-described embodiments of the present invention, a temperature of a wafer and the amount of UV irradiation on the wafer can be controllable by installing a heating block on a wafer transferor or comprising means for controlling an interval between the wafer and a light source. This leads to provide an optimum condition to cause an adhesive on the wafer to lose its adhesive property. Substantially only UV rays, out of various rays generated from the light source, are irradiated on the wafer by installing a UV filter between the light source and the wafer so as to prevent a rise in a temperature of the wafer due to infrared rays and so on. Accordingly, a protective tape on the wafer can be easily eliminated by prevention of sudden cooling of the UV-irradiated wafer down to an ordinary external temperature. When UV rays are irradiated on the wafer UV rays can be uniformly irradiated on the whole surface of the wafer by providing a wafer transferor for moving the wafer in a horizontal direction while rotating the wafer on an axis positioned at a predetermined distance away from a center of the wafer itself. As the result, an adhesive coated on the whole surface of the wafer can be uniformly chemically reacted so that the protective tape is prevented from being partially removed. The wafer transferor is also provided with a heater for controlling a temperature and a wafer array portion for arranging the wafer after the completion of UV irradiation in a predetermined position so that not only the protection tape can be smoothly eliminated but also the wafers are prevented from colliding with the carrier when the wafers are loaded to a carrier. Accordingly the wafers can avoid being damaged.

It should be understood that the invention is not limited to the illustrated embodiment and that many changes and modifications can be made within scope of the invention.

What is claimed is:

1. A UV irradiation apparatus comprising a light source set support in a chamber, a light source connected to said light source set support, a vacuum chuck installed below said light source for supporting a wafer having a protection tape attached to its front side by an adhesive, and a reflector surrounding said light source and arranged to concentrate rays generated by said light source on said vacuum chuck; and said apparatus further comprising:

an adjustable first means, installed between said chamber and said light source set support for moving said light source set support; and an adjustable second means, installed between said light source set support and said light source for moving said light source up and down, and providing for locating said light source at a desired height with respect to said vacuum chuck;

wherein adjusting said first and second means provides for locating the light source at a desired position in said chamber.

2. A UV irradiation apparatus according to claim 1, wherein said first adjustable means comprises a first nut installed in said chamber and a first lead screw inserted in said first nut and linked to said light source support via a lower portion of said first lead screw providing for movement of said light source set support up and down by rotating said first lead screw.

3. A UV irradiation apparatus according to claim 1, wherein said second adjustable means comprises a second nut installed in said light source set support, a second lead screw inserted in said second nut, and a light source fixing block connected to the lower portion of said second lead screw and for fixing said light source so that said light source fixing block can be moved up and down by rotating said second lead screw.

4. A UV irradiation apparatus comprising a light source installed in a chamber, a wafer transport installed below said light source and arranged for moving a wafer having a protective tape attached to its front side by an adhesive, and a reflector surrounding said light source for concentrating UV rays generated from said light source on said wafer transport, said wafer transport comprising:

a table containing a heater for heating said wafer;

a buffer for keeping a wafer waiting on a part of said table after UV irradiation;

a wafer fixing portion arranged for intercepting wafers transferred from said buffer at a predetermined position of said table adjacent to said buffer, arranged for fixing said intercepted wafers, and arranged then eliminating said protective tape; and a wafer array portion configured to arrange said wafer transferred from said wafer fixing portion at a predetermined position of said table adjacent to said wafer fixing portion.

5. A UV irradiation apparatus according to claim 4, wherein said table comprises holes with each arranged for containing a heater at both sides thereof.

6. A UV irradiation apparatus according to claim 4, wherein said wafer fixing portion includes a surface having grooves connected to a vacuum pump such that said wafer is fixed by vacuum.

7. A UV irradiation apparatus according to claim 4, wherein said wafer fixing portion further comprises a plurality of holes in a predetermined position of said table and a stopper in the form of a bar in said holes, arranged so that said wafer transferred from said buffer can be intercepted by said stopper rising above the surface of said table from said holes.

8. A UV irradiation apparatus according to claim 4, wherein said wafer array portion comprises:

a plurality of shafts penetrating said table and fixed to said table in a direction vertical to the direction that said wafer is being transferred;

a pair of wafer holders facing said table of said wafer array portion and arranged to move along said shafts; and a wafer holder driver connected to said wafer holders and arranged for moving said wafer holders towards and away from said table array portion so that said wafer transferred from said wafer fixing portion can be arranged in a predetermined(position of said wafer array position.

9. A UV irradiation apparatus according to claim 8, wherein said wafer holder driver comprises:

a pair of end loads each having a first end connected to the bottom of said wafer holders; and a wafer holder driver axis connected to a second end of both ends loads so that via said end loads said wafer holders are able to move straight along said shaft by rotating.

10. A UV irradiation apparatus comprising:

a light source set support installed in a chamber;

a light source connected to said light source set support;

a vacuum chuck installed below said light source for supporting a wafer having a protective tape attached to its front side by an adhesive;

a UV filter formed from a quartz substrate positioned between said light source and said vacuum chuck, said UV filter arranged to pass UV rays through it but to reflect visible and infrared rays, and comprising a plurality of second material layers coated on its upper surface, said layers comprising ZrO$_2$ and SiO$_2$ layers;

a reflector surrounding said light source and adapted to concentrate rays generated from said light source on said vacuum chuck, wherein said reflector reflects said UV rays while permitting visible and infrared rays to pass through it and escape;

a first adjustable means installed between said chamber and said light source support for moving said light source support; and a second adjustable means installed between said light source support and said light source for moving said light source, whereby said light source can be located at a desired height with respect to said vacuum chuck by said first and second means.

11. A UV irradiation apparatus according to claim 10, wherein said first adjustable means comprises a first nut installed in said chamber, a first lead screw inserted in said first nut, said light source set support being connected to a lower portion of said first lead screw, so that said light source set support can be moved up and down by rotating said first lead screw.

12. A UV irradiation apparatus according to claim 11, wherein said second adjustable means comprises a second nut installed in said light source set support, a second lead screw inserted in said second nut, and a light source fixing block connected to lower portion of said second lead screw, so that said light source fixing block can be moved by rotating said lead second screw.

13. A UV irradiation apparatus comprising a light source installed in a chamber, a wafer transport installed under said light source and adapted for moving said wafer having a protective tape attached to its front side by an adhesive, a reflector surrounding said light source for concentrating UV rays generated from said light source on said wafer transport, wherein said wafer transport comprises:

a vacuum chuck arranged for supporting said wafer;

a vacuum chuck driver located under said vacuum chuck and arranged for enabling said vacuum chuck to move up and down with respect to said light source and to rotate said wafer upon a first axis positioned at a predetermined distance from a center of said vacuum chuck while at the same time moving said wafer straight in a horizontal direction, said vacuum chuck driver comprising:

a cylinder portion connected to a central axis of said vacuum chuck and arranged for moving said vacuum chuck up and down with respect to said light source;

a cylinder fixing block linked with a bottom of said cylinder portion and arranged for fixing said cylinder portion so that said center of said vacuum chuck is at a position offset from said first axis;

a circular pinion gear having a round hole at the center of its bottom side and a central axis of its upper portion, said central axis being fixed to said cylinder fixing block portion at a position protruded from the one side of said cylinder portion;

a rack gear of a linear type installed to be in gear with said pinion gear;

a rack gear fixing block for fixing said rack gear;

a pinion gear support having an upper portion inserted in said pinion gear and having a groove formed around a middle portion of said pinion gear support, said pinion gear support having a plurality of through holes formed in parallel in a lower portion of said pinion gear support;

a planar washer inserted in said groove formed around the middle portion of said pinion gear support, and fixed by being attached to the bottom of said pinion gear;

a plurality of shafts serving as traveling rails by being inserted in said holes for said pinion gear support to allow movement of said pinion gear support in a horizontal direction; and shaft fixing blocks installed at both ends of said shafts in order to fix said shafts.

* * * * *